United States Patent
Sabbag et al.

(10) Patent No.: US 8,553,468 B2
(45) Date of Patent: Oct. 8, 2013

(54) SYSTEM AND METHOD FOR MANAGING ERASE OPERATIONS IN A NON-VOLATILE MEMORY

(75) Inventors: Erez Sabbag, Kiryat Tivon (IL); Avi Steiner, Kiryat Motzkin (IL)

(73) Assignee: Densbits Technologies Ltd., Haifa (IL)

( * ) Notice: Subject to any disclaimer, the term of this patent is extended or adjusted under 35 U.S.C. 154(b) by 211 days.

(21) Appl. No.: 13/238,983

(22) Filed: Sep. 21, 2011

(65) Prior Publication Data

US 2013/0070527 A1    Mar. 21, 2013

(51) Int. Cl.
*G11C 16/04*    (2006.01)

(52) U.S. Cl.
USPC ............ 365/185.29; 365/185.18; 365/185.19; 365/185.22

(58) Field of Classification Search
USPC .............. 365/185.29, 185.18, 185.19, 185.22
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |
| 6,199,188 B1 | 3/2001 | Shen et al. | |
| 6,209,114 B1 | 3/2001 | Wolf et al. | |
| 6,259,627 B1 | 7/2001 | Wong | |
| 6,278,633 B1 | 8/2001 | Wong et al. | |
| 6,279,133 B1 | 8/2001 | Vafai et al. | |
| 6,301,151 B1 | 10/2001 | Engh et al. | |
| 6,370,061 B1 | 4/2002 | Yachareni et al. | |
| 6,374,383 B1 | 4/2002 | Weng | |
| 6,504,891 B1 | 1/2003 | Chevallier | |
| 6,532,169 B1 | 3/2003 | Mann et al. | |
| 6,532,556 B1 | 3/2003 | Wong et al. | |
| 6,553,533 B2 | 4/2003 | Demura et al. | |

(Continued)

OTHER PUBLICATIONS

U.S. Appl. No. 61/445,729, filed Feb. 23, 2011, Weingarten, et al.

(Continued)

*Primary Examiner* — Son Dinh
(74) *Attorney, Agent, or Firm* — Dentons US LLP (57) ABSTRACT

Embodiments of the invention are directed to managing a memory component. A method may include performing a first erase operation according to a first set of erase parameters, determining a result of the first erase operation, modifying the first set erase parameters based on the result to produce a second set of erase parameters and performing a second erase operation according to a second set of erase parameters. A condition parameter may be maintained based on the erased parameters and/or based on a result of an erase procedure.

20 Claims, 6 Drawing Sheets

(56) References Cited

U.S. PATENT DOCUMENTS

| | | |
|---|---|---|
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,839,690 B2 * | 11/2010 | Lee et al. .................. 365/185.18 |
| 7,844,877 B2 | 11/2010 | Litsyn et al. |
| 7,916,543 B2 * | 3/2011 | Goda et al. ................ 365/185.17 |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima et al. |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Sokolov et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2010/0005270 A1 | 1/2010 | Jiang |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |

| | | |
|---|---|---|
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0293321 A1 | 11/2010 | Weingarten |
| 2011/0051521 A1 | 3/2011 | Levy et al. |
| 2011/0055461 A1 | 3/2011 | Steiner et al. |
| 2011/0096612 A1 | 4/2011 | Steiner et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0214029 A1 | 9/2011 | Steiner et al. |
| 2011/0214039 A1 | 9/2011 | Steiner et al. |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |

OTHER PUBLICATIONS

Search Report of PCT Patent Application WO 2009/118720 A3.
Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Kcshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, p. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips. com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built In Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

SYSTEM AND METHOD FOR MANAGING ERASE OPERATIONS IN A NON-VOLATILE MEMORY

FIELD OF THE INVENTION

The present invention relates generally to non-volatile memory, and particularly to monitoring and/or managing erase operations in a flash memory.

BACKGROUND OF THE INVENTION

Nonvolatile flash memory devices store information in the form of charge in a flash cell. A flash cell typically includes a complementary metal oxide semiconductor (CMOS) transistor with an additional floating metal gate between the substrate and the transistor's gate. In operation, a charge is stored in the floating gate. The charge is injected to the floating gate during an operation known as programming The charge may be removed during an operation known as an erase operation. As the charge stored in the floating gate may vary, it is possible to store information representing more than just one bit per flash cell by using several charge levels to represent different sequences (or values) of a number of bits. Otherwise described, to represent different values related to different bit sequences, different charges (which may be observed as different voltage levels) may be stored in a floating metal gate of a flash cell.

Figure 1:
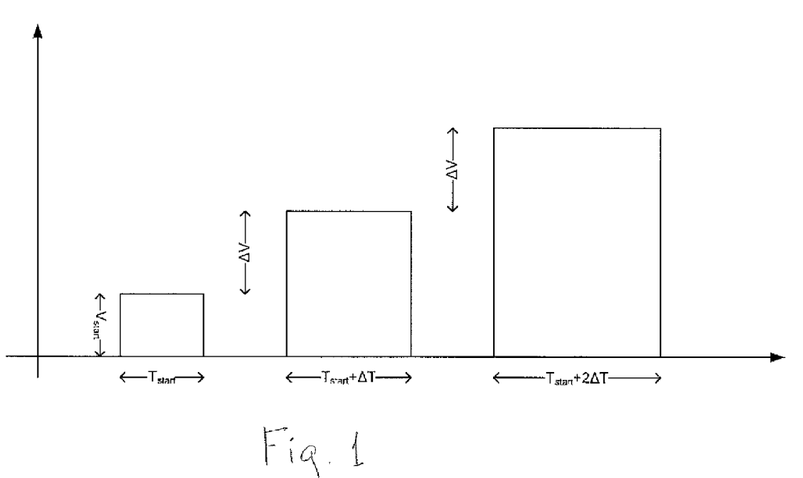
FIG. 1 is an exemplary figure showing duration and pulse magnitude of erase pulses during the erase process.

Typically, P/E cycles are applied to a block of flash cells. A block erase operation typically involves charging all cells in the block to some high programming level, and applying a set of erase pulses. For example, as shown in FIG. 1, the pulse duration and pulse magnitude may be controlled during the erase process. This may be done, for example, by setting initial and incremental step values of time (e.g., Tstart and $\Delta T$), and pulse magnitude (Vstart and $\Delta V$), as well as total number of pulses applied. After each pulse (or set of pulses) an internal module or the controller verifies that all cells in the block are erased. If so, the erase process ends. Otherwise, additional erase pluses are applied. Additional pulses typically have increased erase voltage or increased pulse duration. This process may continue until the number of erase pluses exceeds the maximum allowable number of erase pluses. A single program/erase (P/E) cycle is defined to be a programming phase of a block of flash cells and the activation of an erase command, which in turn may cause a controller to perform and/or activate the erase-verify procedure described above.

Erase operations are known to cause deterioration in the reliability of a flash cell's storage ability, due to the high voltages that must be applied during erase operations. While individual erase operations may not have noticeable effect, over many erase cycles, they may have a cumulative deleterious effect on the cells. Therefore, reducing these effects can dramatically improve the flash cell's reliability and increase the overall amount of P/E cycles per physical block.

A drawback of current systems and methods is that, following a number of program/erase (P/E) cycles applied to a flash cell, electric charge may be accumulated or trapped in a flash cell. This effect is referred to as cycling effect. Another effect is known as retention, in which the cells discharge as time goes by. With retention, an effective working window of voltage levels may shrink, shift and/or otherwise change, resulting an increased error rate that may be related to reading data from the flash cell and/or removing data from the flash cell. Retention effects are known to become significantly worse as the number of P/E cycles increases.

SUMMARY OF EMBODIMENTS OF THE INVENTION

Embodiments of the invention are directed to managing a memory component. A method may include performing a first erase operation according to a first set of erase parameters, determining a result of the first erase operation, modifying the first set erase parameters based on the result to produce a second set of erase parameters and performing a second erase operation according to a second set of erase parameters. A condition parameter may be maintained and/or updated based erased parameters used in an erase procedure and/or based on a result of an erase procedure. Erase parameters may be set based on a condition parameter. Specifically, erase parameters such as the number of pulses applied, pulse duration, voltage level and total amount of energy (or measurements which are proportional to the energy) used in an erase procedure may be recorded and/or used to update a condition parameter that may reflect a condition or age of a memory component. Erase parameters may be updated dynamically and/or adaptively. For example, based on a result of a first erase cycle, erase parameters may be updated or modified and a second erase cycle may be performed based on the modified erase parameters.

BRIEF DESCRIPTION OF THE DRAWINGS

Embodiments of the invention are illustrated by way of example and not limitation in the figures of the accompanying drawings, in which like reference numerals indicate corresponding, analogous or similar elements. The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity, or several physical components may be included in one functional block or element. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention. Some features or elements described with respect to one embodiment may be combined with features or elements described with respect to other embodiments. For the sake of clarity, discussion of same or similar features or elements may not be repeated.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information storage medium that may store instructions to perform operations and/or processes.

Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. For example, "a plurality of devices" may include two or more devices. Unless explicitly stated, the method embodiments described herein are not constrained to a particular order or sequence. Additionally, some of the described method embodiments or elements thereof can occur or be performed simultaneously, at the same point in time, or concurrently.

Figure 2:
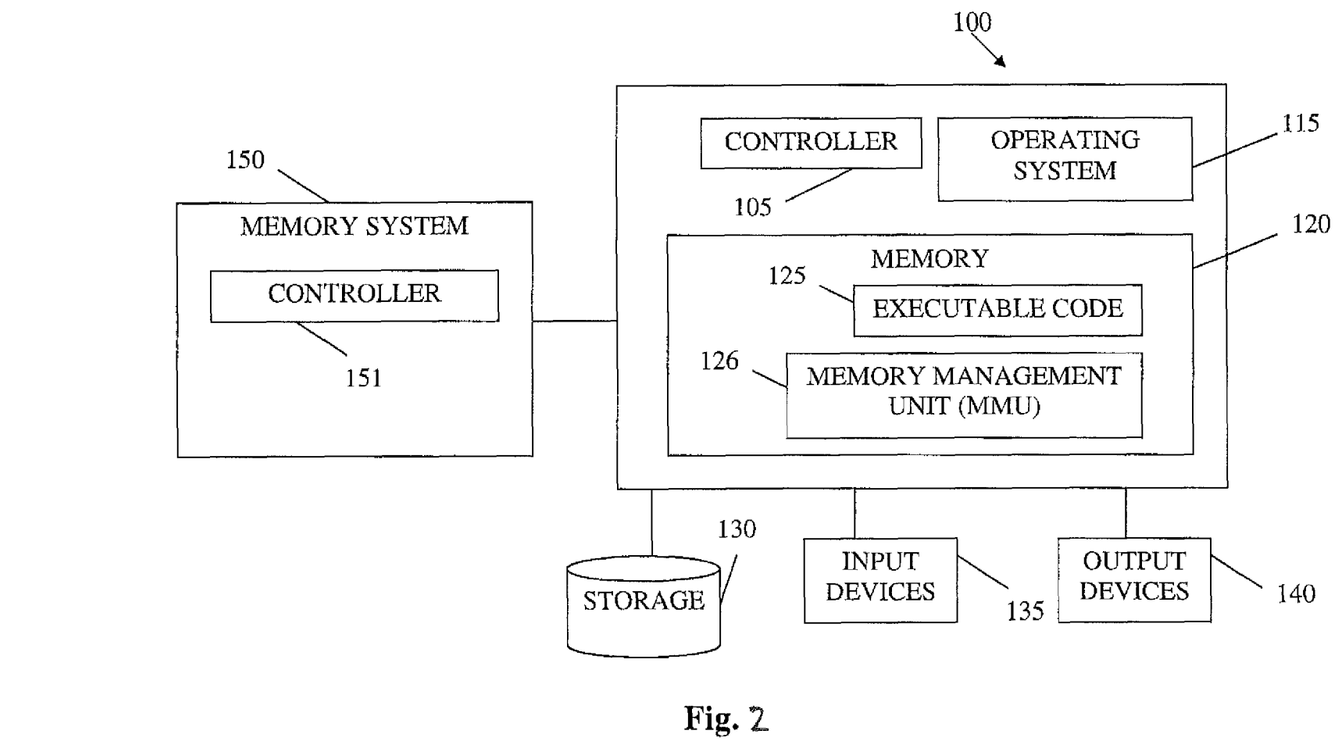
FIG. 2 shows high level block diagram of an exemplary computing device and a memory system according to embodiments of the present invention.

Reference is made to FIG. 2, which shows high level block diagram of an exemplary computing device 100 and a memory system 150, according to embodiments of the present invention. As shown, the computing device may be operatively connected to memory system 150. It will be understood that although memory system 150 is shown as external to computing device 100, other configurations are possible. For example, memory system 150 may be internal to computing device 100 (e.g., part of memory 120). Memory system 150 may be or may include nonvolatile flash memory components, such as blocks or pages of nonvolatile flash memory components that include flash cells.

For example, memory system 150 may include flash cells including complementary metal-oxide-semiconductor (CMOS) transistors with floating metal gates between a substrate and the transistors' gates. A charge may be stored in the floating gate, and may be injected to the floating gate during a programming operation. The charge may be removed during an erase operation.

As shown, memory system 150 may include a controller 151, which may be internal to the memory system 150, which may control, manage and/or monitor any operational or other aspects of memory system 150. For example, internal controller 151 may examine components of memory system 150 and report a state of memory system 150. For example, the number and/or reference of flash cells storing data may be reported by internal controller 151 or the number of erased flash cells may be determined and/or reported by internal controller 151. Internal controller 151 may perform operations such as activating a sequence of one or more erase pulses and/or setting an erase pulse's duration, power or voltage level or other parameters.

Computing device 100 may include a controller 105 that may be, for example, a central processing unit processor (CPU), a chip, or any suitable computing or computational device, an operating system 115, a memory 120, a storage 130, an input devices 135 and an output devices 140. Operating system 115 may be or may include any code segment designed and/or configured to perform tasks involving coordination, scheduling, arbitration, supervising, controlling or otherwise managing operation of computing device 100, for example, scheduling execution of programs. Operating system 115 may be a commercial operating system.

Memory 120 may be or may include, for example, a Random Access Memory (RAM), a read only memory (ROM), a Dynamic RAM (DRAM), a Synchronous DRAM (SD-RAM), a double data rate (DDR) memory chip, a Flash memory, a volatile memory, a non-volatile memory, a cache memory, a buffer, a short term memory unit, a long term memory unit, or other suitable memory units or storage units. Memory 120 may be or may include a plurality of, possibly different memory units.

Executable code 125 may be or may include any executable code, e.g., software driver, an application, a program, a process, task or script. Executable code 125 may be executed by controller 105 possibly under control of operating system 115. Memory management unit (MMU) 126 may be an application or driver or an executable code similar to executable code 125. MMU 126 may perform any control, management and/or configuration tasks related to memory system 150, e.g., methods and operations as described herein. Storage 130 may be or may include, for example, a hard disk drive, a universal serial bus (USB) device or other suitable removable and/or fixed storage unit. Input devices 135 may be or may include a mouse, a keyboard, a touch screen or pad or any suitable input device. It will be recognized that any suitable number of input devices may be operatively connected to computing device 100 as shown by block 135. Output devices 140 may include one or more displays, speakers and/or any other suitable output devices. It will be recognized that any suitable number of output devices may be operatively connected to computing device 100 as shown by block 140. Any applicable input/output (I/O) devices may be connected to computing device 100 as shown by blocks 135 and 140. For example, a wired or wireless network interface card (NIC), a universal serial bus (USB) device or external hard drive may be included in input devices 135 and/or output devices 140.

Embodiments of the invention may include an article such as a computer or processor non-transitory readable medium, or a computer or processor non-transitory storage medium, such as for example a memory, a disk drive, or a USB flash memory, encoding, including or storing instructions, e.g., computer-executable instructions, which, when executed by a processor or controller, carry out methods disclosed herein. For example, a storage medium such as memory 120, computer-executable instructions such as executable code 125 or MMU 126 and a controller such as controller 105.

Some embodiments may be provided in a computer program product that may include a non-transitory machine-readable medium (e.g., memory 120), stored thereon instructions (e.g., MMU 126), which may be used to program a computer (e.g., device 100), or other programmable devices, to perform methods as disclosed herein. Embodiments of the invention may include an article such as a computer or processor non-transitory readable medium, or a computer or processor non-transitory storage medium, such as for example memory 120, a disk drive, or a USB flash memory, encoding, including or storing instructions, computer-executable instructions (e.g., executable code 125 or MMU 126), which when executed by a processor or controller, carry out methods disclosed herein. The storage medium (e.g., memory 120) may include, but is not limited to, any type of disk including floppy disks, optical disks, compact disk read-only memories (CD-ROMs), rewritable compact disk (CD-RWs), and magneto-optical disks, semiconductor devices such as read-only memories (ROMs), random access memories (RAMs), such as a dynamic RAM (DRAM), erasable programmable read-only memories (EPROMs), flash memories, electrically erasable programmable read-only memories (EEPROMs), magnetic or optical cards, or any type of media suitable for storing electronic instructions, including programmable storage devices.

A system according to embodiments of the invention may include components such as, but not limited to, a plurality of central processing units (CPU) or any other suitable multipurpose or specific processors or controllers, a plurality of input units, a plurality of output units, a plurality of external or internal memory units, and a plurality of storage units. A system may additionally include other suitable hardware components and/or software components. In some embodiments, a system may include or may be, for example, a personal computer, a desktop computer, a mobile computer, a laptop computer, a notebook computer, a workstation, a server computer, a Personal Digital Assistant (PDA) device, a tablet computer, a network device, or any other suitable computing device.

Embodiments of the invention may be directed to managing, controlling, monitoring, and/or operating a memory component. Specifically, embodiments of the invention may be directed to managing and/or controlling programming and erasing (P/E) memory components that include multiple bits per cell (bpc) flash memory cells.

In conventional systems, a P/E cycle counter is typically used to count the number of P/E cycles applied to a memory block, page or other component that may include a large number of flash memory cells. The P/E counter may be used alone to indicate a reliability condition of the memory block. However, a P/E counter may not represent the true condition of a memory component. For example, following a number of erase pulses, a first block in a memory may still store data, while all data in a second block may be erased, for example, in the case where the first block includes cells which are hard to erase.

However, as the P/E counter is global with respect to a memory component that includes the first and second blocks, it may not adequately represent the different states of the first and second blocks. Furthermore, a P/E counter fails to take account of other parameters other than the number of P/E cycles. For example, a P/E counter does not indicate or reflect the amount of energy used during the erase operation on a cell, the duration of time during which a memory block was subject to erase pulses, the number of erase pulses applied, etc.

According to embodiments of the invention, a condition parameter, which may be based on various physical aspects of the actual P/E cycles performed, may be maintained. For example, such a physical parameter may include or be based on the cumulative total amount of energy used in some or all past P/E cycles, which may allow embodiments of the invention to determine or monitor a condition of a memory component more accurately than the conventionally used P/E counter. By accurately determining a condition of a memory component, embodiments of the invention may improve operations such as erase operation by setting erase parameters (e.g., pulse characteristics, amount of energy or error rate or level) according to the condition of the memory component.

Furthermore, using an accurate condition parameter, embodiments of the invention may improve P/E operations, e.g., by adaptively determining an error level or rate. For example, the number of errors produced by an erase procedure may be adaptively set according to a condition parameter that may, in turn, be updated based on the total number of pulses applied, the total amount of energy endured by a memory component etc. This, in turn, can extend the overall life span of the device in terms of P/E cycles.

According to embodiments of the invention, a condition of a memory component may be evaluated, represented or indicated based on the total number of erase pulses applied to the component.

Figure 3A:
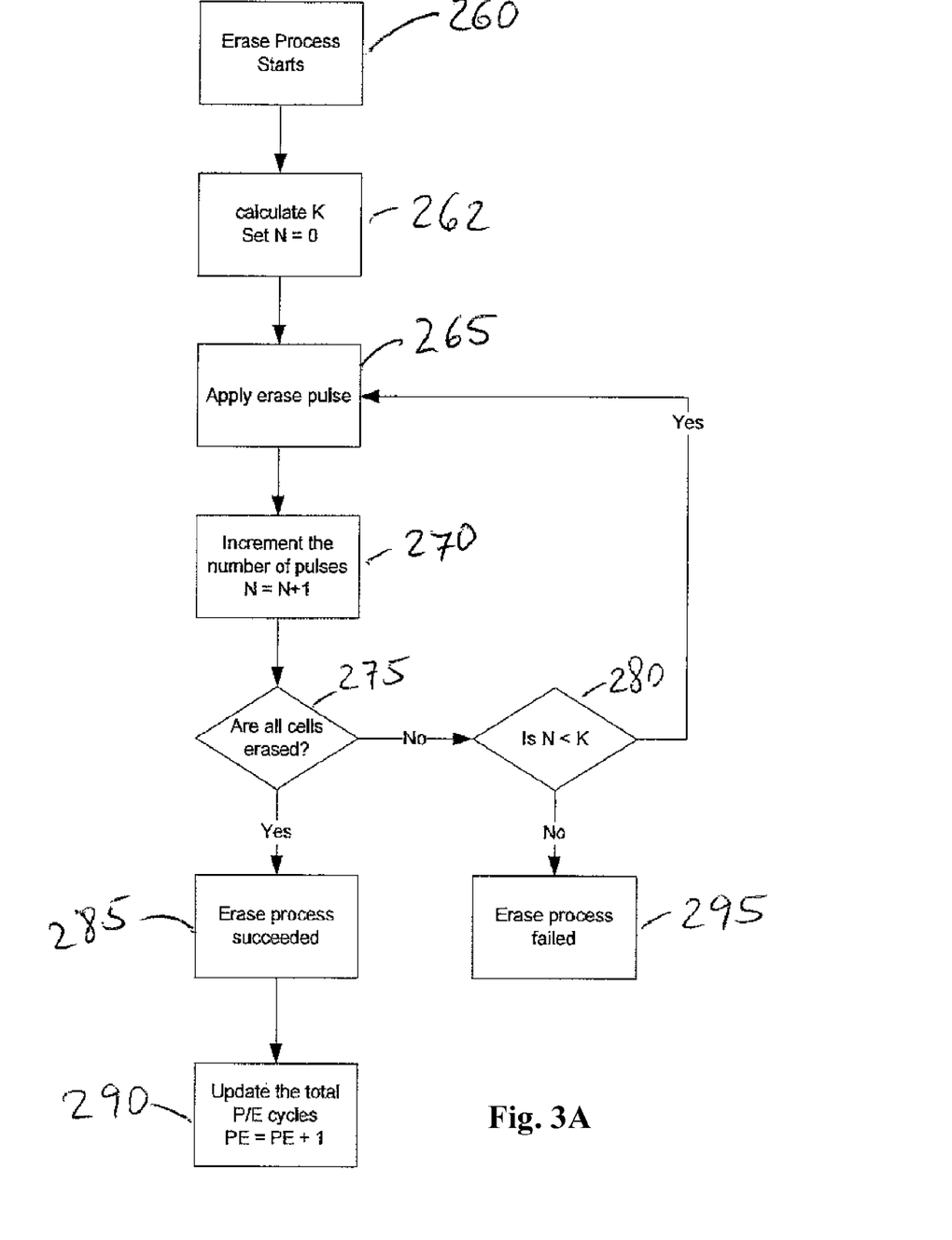
FIG. 3A is a flowchart diagram illustrating a method helpful in understanding embodiments of the present invention.

Reference is made to FIG. 3A, which graphically depicts a method or flow helpful in understanding embodiments of the invention.

As shown by 260, a data erase operation in a memory component may begin. At stage 262, threshold parameter K may be calculated or preconfigured, as described herein, and pulse counter (N) may be set (or reset) to zero ("0"). As shown by 265, an erase pulse may be applied. As shown by 270, the pulse counter N may be incremented to reflect the current number of pulses applied. As shown by 275, the memory component may be examined to determine whether data in all cells included in the memory component has been erased. It will be recognized that an erase operation may typically include programming all cells to some high program level, and then applying one or more erase pulses. Accordingly, cells that are not yet erased may refer to cells corresponding to a voltage threshold above the erase level.

As shown by 280, after being incremented, the current number of pulses N may be compared to a threshold parameter K, which may be dynamically set or may be preconfigured. As shown by 295, if the number of currently applied pulses is larger than a threshold parameter, the process may be terminated. Any result or parameter may be stored. Any information stored, may be used, e.g., in a subsequent or current erase operation. As shown by the arrow connecting blocks 280 and 265, if the number of pulses applied in the current erase operation is less than the threshold parameter (denoted by K), the method or flow may repeat the operations described with respect to blocks 265, 270 and 275. Accordingly, the number of pulses applied in the current erase operation may be stored in the counter N.

As shown by 285, if the erase operation is successful, a process may proceed to operation 290. As shown by block 290, the number of P/E cycles applied to the memory component may be incremented and recorded.

However, as described above, monitoring and setting erase parameters based solely on the number of P/E cycles (e.g., in FIG. 3A) may limit system life span in terms of actual P/E cycles. Accordingly, embodiments of the invention may set erase parameters based on a measure of the overall condition of a memory component to improve system life span in terms of actual P/E cycles (e.g., in FIG. 3B).

Figure 3B:
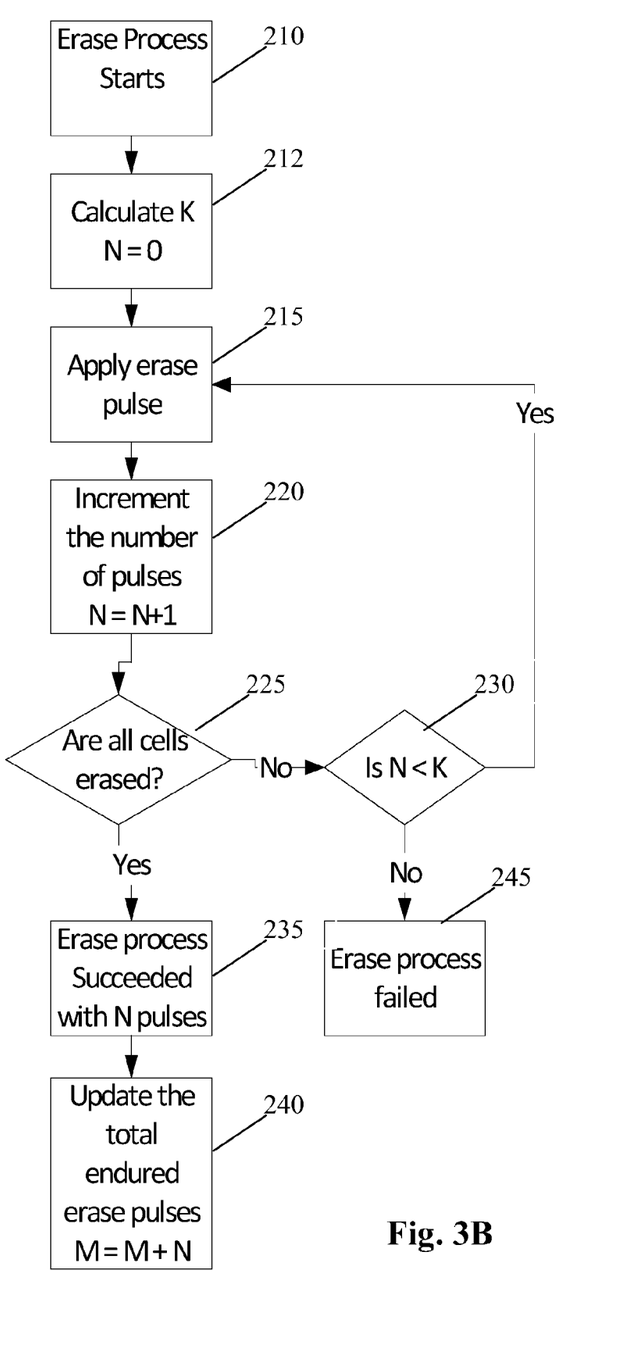
FIG. 3B is a flowchart diagram illustrating a method according to embodiments of the present invention.

Reference is made to FIG. 3B, which graphically depicts a method or flow according to embodiments of the invention. It will be noted that methods and/or operations described herein may be applied to any suitable memory component, e.g., a memory block, page, cell or system.

As shown by 210, a data erase operation in a memory component may begin. At stage 212, threshold parameter K may be calculated, as described herein, and pulse counter (N) may be set (or reset) to zero ("0"). As shown by 215, an erase pulse may be applied. For example, MMU 126 may instruct controller 151 to apply an erase pulse. As shown by 220, the pulse counter N may be incremented (e.g., by MMU 126) to reflect the current number of pulses applied. As shown by 225, the memory component may be examined to determine whether data in all cells included in the memory component has been erased. For example, controller 151 may report to MMU 126 the number of cells erased, the number of cells still storing data or any other parameter based on which MMU 126 may determine the number of cells that are not yet erased after an application of an erase pulse as shown by 215. It will be recognized that an erase operation may typically include programming all cells to some high program level, and then applying one or more erase pulses. Accordingly, cells that are not yet erased may refer to cells corresponding to a voltage threshold above the erase level.

As shown by 230, after being incremented, the current number of pulses N may be compared to a threshold parameter K, which may be dynamically set or may be preconfigured. As shown by 245, if the number of currently applied pulses is larger than a threshold parameter, the process may be terminated. Any result or parameter may be stored. For example, MMU 126 may store any information related to memory system 150 on storage 130. Any information stored, e.g., on storage 130 may be used, e.g., in a subsequent or current erase operation. As shown by the arrow connecting blocks 230 and 215, if the number of pulses applied in the current erase operation is less than the threshold parameter (denoted by K), the method or flow may repeat the operations described with respect to blocks 215, 220 and 225. Accordingly, the number of pulses applied in the current erase operation may be stored in the counter N.

As shown by 235, if the erase operation is successful, e.g., controller 151 reports that all cells in memory 150 have been successfully erased, it may be determined that the erase operation has succeeded, and the number of pulses applied (N) may be recorded (e.g., on storage 130). As shown by block 240, a global or total number of pulses applied to the memory component may be calculated by adding the current pulse counter N to a global or total counter M. For example, M may store the total number of pulses applied to a memory component over days, weeks or years.

In some cases, internal controller 151 may be instructed to delete data in a memory component, may perform the erase operation and may further report the number of pulses required. In such case, some of the operations described above with respect to FIGS. 3A and 3B may be omitted. In other cases, e.g., if controller 151 is not configured to independently perform an erase operation and/or report the number of pulses required, MMU 126 may instruct controller 151 (or other relevant component) to apply a single pulse and the state of the memory component (e.g., erase status) may be examined after each application of such single pulse. According to embodiments of the invention, the total or global number of pulses applied to a memory component (e.g., M in the above described method) may be used to estimate or indicate the true condition of the memory component, e.g., the condition of a memory a block.

Any value, number or parameter determined, calculated or derived based on operations or flows described herein may be stored and/or used. For example, following a completion of each erase process, MMU 126 may store the number of pulses applied in the current erase process (e.g., the value of N at the end of the process as shown by block 235). Accordingly, a change, variance, gradient or other parameter indicating a change of N over time and/or erase processes may be observed, and a condition of the relevant memory component may be determined or estimated. Any operation may be based on such stored information. For example, based on one or more previous N values the number of pulses required in a current erase operation may be determined In some cases, following a storage of the number of pulses N applied in previous erase operation, in a subsequent erase operation, MMU 126 may relate the number of pulses required to successfully erase a block of memory (the current N) to the number of pulses required in the previous erase operation (the previous N) and may determine a condition of the memory block by observing the relations between such two values. Any number of parameters related to any number of operations may be stored and used. Accordingly, any computation based on any previous or historical values or parameters may be performed in order to determine a condition of a memory component.

As described herein, any number, value or parameter related to an erase process, a P/E cycle or any interaction with a memory component may be recorded and/or used to determine a condition of the memory component and/or determine parameters related to an operation related to the memory component. For example, the amount of energy required in order to delete data in a memory component may be calculated or estimated. For example, the amount of energy may be calculated as the product of pulse duration and pulse voltage. The sum of energy required to delete data in a memory component (e.g., used in a process as described with respect to FIG. 3B) may be calculated and recorded. For example, MMU 126 may set (or internal controller 151 may report to MMU 126), values such as pulse duration, pulse voltage levels and/or number of pulses applied, and MMU 126 may, based on such information, compute (and/or record) the total amount of energy applied.

In some embodiments, a condition of a memory component may be computed, calculated, derived or determined dynamically, e.g., during an erase process. For example, following an application of one or more erase pulses, the number of non-erased cells (cells still storing data at a given read threshold value) may be determined (e.g., as reported by controller 151) and the number of erase pulses applied may be to compute the a condition of a block or other memory component. For example, a table or function that maps a pulse count and number of non-erased cells may be provided to MMU 126 that may use such function or table to calculate a condition parameter based on a pulse count and number of non-erased cells. As described herein, based on one or more condition parameters, future erase parameters, e.g., amount of energy, number of pulses, pulse duration, pulse voltage or any other pulse characteristics may be computed, stored and used in subsequent operations.

Flash cells in a memory component are typically not truly identical to each other, due to various reasons, e.g., manufacturing conditions, doping substance impurities, differential temperature or heat, etc. Accordingly, a pulse may delete data in a first cell but fail to delete data in a second cell. In some cases, an erase process may be prolonged due to a few flash cells which are difficult to erase. Accordingly, additional or excess pulses, which may harm the memory component, may be needed in order for all the cells included in a memory block or component to be erased.

According to embodiments of the invention, an erase process may be terminated when a threshold number or percentage of cells are erased and/or when a threshold number, portion or percentage of cells are still storing data.

Although terminating an erase process when some of the cells are not erased (namely, still storing data) can cause a programming error with high probability, the number of non-erased cells may be kept small. The non-erased cells may induce programming errors, such that newly programmed data following a partially erased block may contain errors.

According to an embodiment of the invention these errors can be fixed using an error correction code (ECC) that may be incorporated in flash controllers such as controller 151.

To obtain extra reliability, the controller may store information defining the position of bits which were not properly erased and may use this information later during decoding (e.g., after programming) This information may be used as erasure information. In coding theory, erasure information provides a new state of a symbol (or a bit) in which the exact polarity of the bit (i.e., '0' or '1') may not be determined This additional information may further reduce the probability of decoding failure.

Terminating an erase process based on a threshold parameter may increase a flash device's life span (in terms of P/E cycles) as well as shorten an erase process duration.

According to embodiments of the invention, the threshold parameter (e.g., the number or percentage of cells to be left non-erased or storing data when the erase process terminates) may be dynamically or otherwise set, tuned or determined For example, a condition parameter (e.g., derived as described herein) may be used in order to determine an erase termination threshold. For example, an erase termination threshold may be set based on an amount of energy required to delete data in a memory block (e.g., an amount of energy determined as described herein) or a termination threshold may be set based on a total number of pulses already applied to a memory component (e.g., M in FIG. 3B). In some embodiments, the erase termination threshold may set based on the total number of P/E cycles applied to the memory component or other age parameter. For example, an ECC may be designed to accommodate errors in a relatively "old" memory component (e.g., suited for end-of-life conditions) or a specific condition of the component. In such case, the threshold may be adapted to the age (e.g., an age represented in number of P/E cycles) such that the error rate is always within the capacity of the ECC. For example, the erase termination threshold may be dynamically lowered based on the total number of P/E cycles applied to a memory component.

Figure 4:
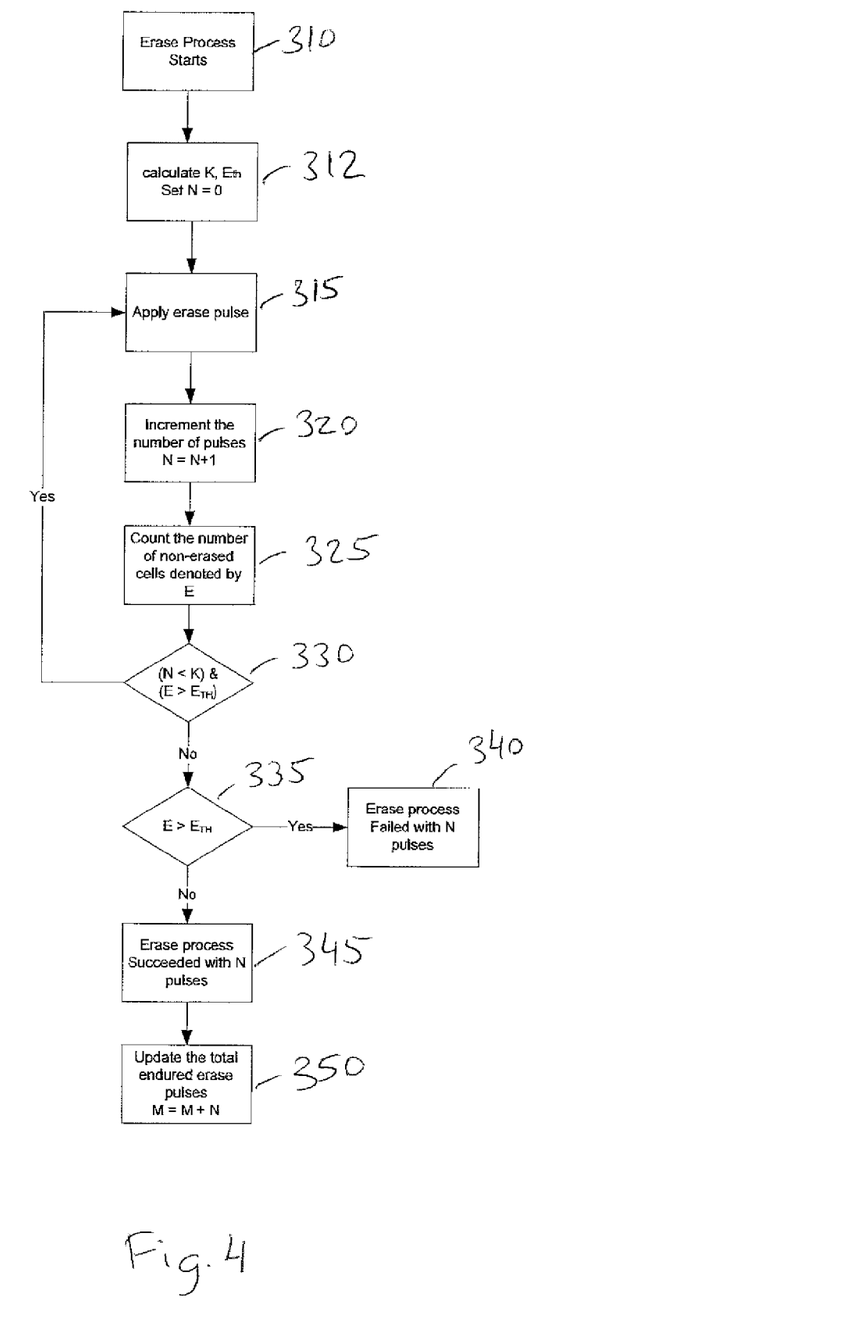
FIG. 4 is a flowchart diagram illustrating a method according to embodiments of the present invention.

Reference is made to FIG. 4, which graphically depicts a method or flow according to embodiments of the invention. It will be noted that steps and/or operations in flows or methods described herein may be performed in any order. Some operations may be repeated or omitted. As shown in FIG. 4, operations shown in blocks 310, 312, 315 and 320 may be similar to respective operations 210, 212, 215 and 220 shown in FIG. 3B. As shown by block 325, following an application of an erase pulse, the number of cells that were not erased may be determined For example, controller 151 may report the number of flash cells still storing information following an application of an erase pulse. The number of non-erased cells may be related to a given logical page, block, row or any subset of a block. Any method of determining whether data in cells was deleted may be used, e.g., based on the relevant memory component.

As shown by block 330, the number of non-erased cells in a given read threshold value (denoted by E in FIG. 4) may be compared or otherwise related to a threshold $E_{th}$ that may be dynamically or otherwise set. For example, $E_{th}$ may be a percentage or it may be an actual number of cells with $V_{th}$ above 0V. As discussed, $E_{th}$ set based on an age of a memory component, based on the number of P/E cycles already applied to a component, based on a condition of a component (e.g., a condition parameter set or defined as described herein). As shown by the arrow connecting blocks 330 and 315, if the threshold has not been breached, e.g., the number of non-erased cells is below the threshold, an additional erase pulse may be applied.

As further shown by block 330, the number of pulses applied (N) may be compared to a threshold (denote by K in FIG. 4). As shown by the arrow connecting blocks 330 and 315, if the number of pulses N has not reached or is not larger than a threshold K, an additional erase pulse may be applied. Although as shown, a single check may include or be related to the number of non-erased cells and the number of pulses applied, some embodiments may apply separate examinations of these aspects. Accordingly, in some embodiments, based on various conditions, additional pulses may be applied even if the number of pulses has reached a predefined limit or even if the number of non-erased cells is below a predefined threshold.

As shown by blocks 335 and 340, if it was determined that no additional pulses are to be applied in the current erase process because the maximal number of pulses has been reached and the number of non-erased cells is higher than the threshold K, the erase process may be terminated and an indication of failure may be generated and/or recorded. Any parameter may be recorded, e.g., the number of pulses applied in the current process, the number of non-erased cells etc.

As shown by block 345, if the number of pulses applied is below a first threshold (K) and the number of non-erased cells is below a second threshold ($E_{th}$) then it may be determined the process was successful. As shown by block 350, similarly to block 240 in FIG. 3B, the total number of pulses applied may be recorded. For the sake of simplicity and clarity, block 350 does not list all parameters that may be recorded upon termination of an erase process, however, it will be understood that any parameter may be recorded. Any parameter, e.g., K, $E_{th}$, as well as pulse duration, voltage etc. may be determined, e.g., in a subsequent erase process, based on parameters recorded as shown by blocks 350 and 240.

According to embodiments of the invention, any parameter, threshold, count or other value may be dynamically set, e.g., during an erase operation. For example, parameters such as, but not limited to, an erase program voltage, a maximal number of pulses, a pulse duration or an erase voltage step may be set dynamically. For example, based on a result (e.g., the number of non-erased cells) in a first iteration, one or more of the above mentioned parameters or other parameters may be defined, set or modified. In some embodiments, parameters may be set and stored upon a termination of an erase process and used in a subsequent erase process or procedure.

By dynamically and/or adaptively setting or modifying erase parameters (e.g., pulse height, pulse duration, number of pulses applied and the like) embodiments of the invention may improve utilization of a flash memory component. For example, by applying a number of erase cycles to a memory and dynamically and/or adaptively setting erase parameters between cycles, embodiments of the invention may determine and use an optimal set of erase parameters in an erase operation or procedure. For example, the amount of energy (e.g., as reflected by the number of pulses or relevant pulse characteristics) may be optimal, e.g., no more than the amount of required energy is used. Generally, an adaptive erase procedure may include attempting to erase a programmed memory block at the lowest erase voltage and/or the minimal number of erase pulses. A procedure may include determining an erase result, e.g., by a counter provided by an internal counter (e.g., maintained by an internal controller) or by directly attempting to read data from memory cells and determining the number of cells storing data and/or the number of cells on which data was erased. If the number of errors (e.g., number of non-erased cells) exceeds a threshold, then an adaptive erase flow, method or procedure may modify erase parameters based on a result of a previous cycle or operation. For example, erase voltage and/or number of erase pulses and/or erase pulse duration and/or erase voltage step parameters may be modified based on the number of cells in a memory component with respect to which a previous erase cycle or procedure failed to delete data.

In an embodiment of the invention, the adaptation of erase parameters may take place for every set of P/E cycles, and not necessarily for every erase operation. This approach may reduce the complexity involved in optimizing the erase parameters from a controller. Parameter adaptation may involve several erase and read attempts with different parameters, and therefore, once the parameters are set, they may be used by the controller for other memory blocks with the same or similar P/E cycle range.

Figure 5:
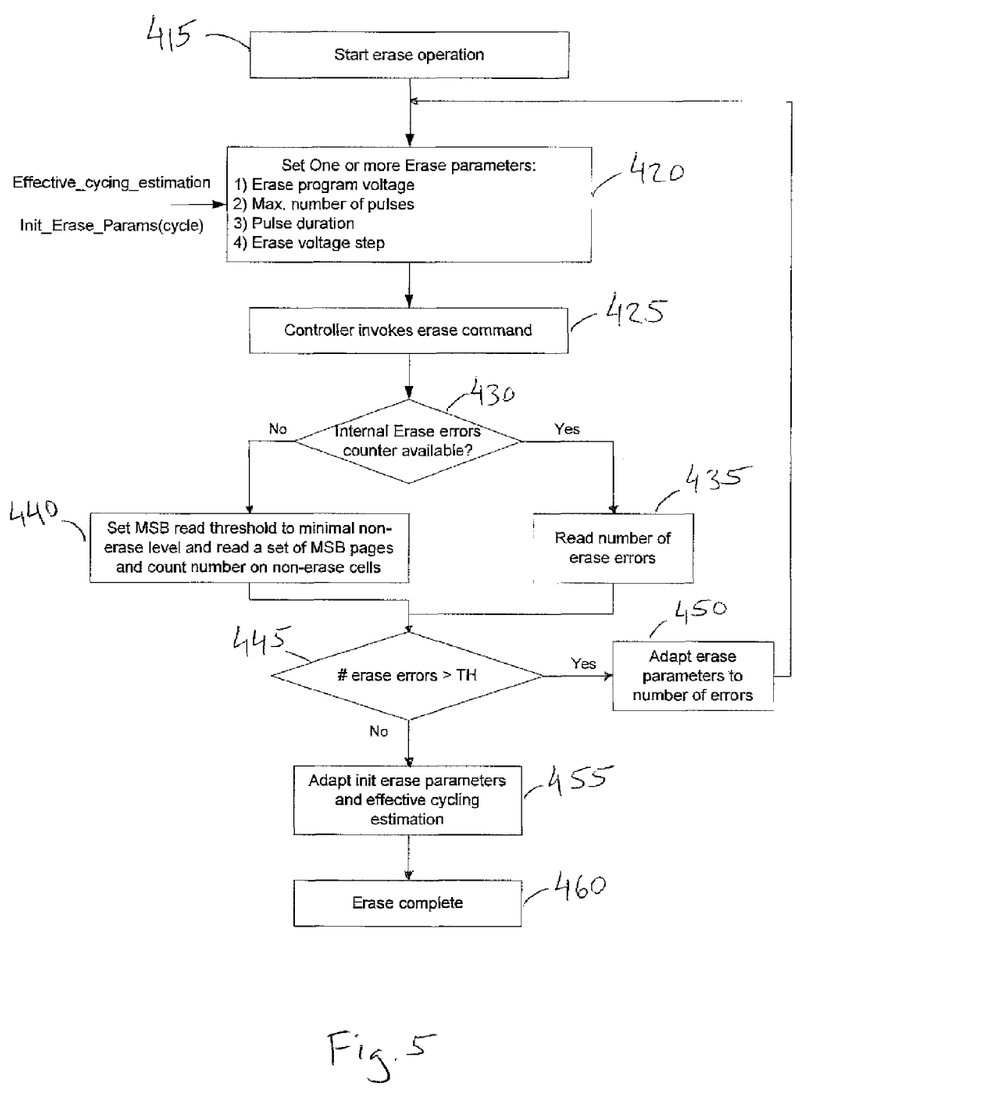
FIG. 5 is a flowchart diagram illustrating a method according to embodiments of the present invention.

Reference is made to FIG. 5, which graphically depicts a method or flow according to embodiments of the invention. It will be noted that parameters set or modified as shown in FIG. 5 are exemplary ones and that any other applicable parameters, values, thresholds or numbers may be dynamically set during an erase procedure and/or upon a termination of an erase procedure. As shown by block 415, an erase operation may be initiated, e.g., controller 105 may receive a command to erase data in a memory block included in memory system 150.

As shown by block 420, erase parameters may be selected. For example and as shown, a voltage level applied to memory cells, the number of pulses applied, the duration or length of pulses applied may be set or selected and a voltage step used to increase the applied voltage may be selected, determined or set. As shown by block 425, an erase command may be issued. For example, after setting erase parameters as shown by block 420, controller may invoke an erase operation based on the erase parameters set as shown in block 420.

As shown by block 430, a result of an erase procedure or operation (e.g., performed by controller 151) may be examined and errors may be identified. As shown by 435, if a counter or other construct or parameter is available (e.g., a counter maintained by controller 151), the counter may be read. Otherwise, as shown by 440, the number of cells that were not erased, namely, the number of cells storing data after an erase operation may be determined by directly counting cells still storing data or by otherwise examining a memory to determine the number of cells that are not fully erased. As shown by block 445, the number of erase errors, e.g., as reflected by the number of non-erased cells may be compared to a threshold parameter.

As shown by 450, if the number of cells not erased, or number of cells storing data following an erase operation is higher than the threshold, erase parameters may be modified. For example, modification of erase parameters may be based on the number or percentage of cells on which data was successfully erased or deleted. In other embodiments, modification of erase parameters may be based on the number or percentage of cells on which the erase procedure failed to delete data. As shown by the arrow connecting blocks 450 and 420, following a failure to successfully delete data from all or a portion of cells in a memory, the flow or method may repeat operations such as an erase operation according to modified erase parameters.

As shown by block 455, erase parameters may be modified, e.g., based on an overall result of a number of erase iterations or procedures. A condition parameter may be updated as shown by block 455. For example, based on the voltage level applied, total amount of energy applied (e.g., calculated as the product of pulse voltage and pulse duration), number of pulses etc., a condition parameter may be updated such that the effect of the erase procedure is reflected by the condition parameter. For example, a value of an age parameter reflecting an effective age of a memory system may be increased according to the total amount of energy used in an erase procedure as shown by FIG. 5.

As shown by block 460, the flow may be terminated. Termination of a flow may include recording any relevant parameters. For example, based on the number of pulses applied, the total energy used and/or other erase parameters, parameters for subsequent or future erase operations may be set. For example, an estimated number of pulses, pulse duration or other erase parameters that may be optimal for a subsequent or future erase operation may be recorded and used in a subsequent operation. For example, setting erase parameters as shown by block 420 may include setting erase parameters based on erase parameters determined and stored in a previous erase operation, e.g., as shown by block 455.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of managing information in a set of flash memory cells included in a memory block, the method comprising:
    performing a first erase operation, the operation including applying a first number of erase pulses to the memory block;
    calculating an erase indicator based on counting flash memory cells storing data;
    based on the erase indicator, determining a second number of erase pulses; and
    performing a second erase operation including the second number of erase pulses.

2. The method of claim 1, comprising:
    performing the first erase operation according to a first erase voltage level;
    based on the erase indicator, determining a second erase voltage level; and
    performing the second erase operation according to the second erase voltage level.

3. The method of claim 1, comprising:
    performing the first erase operation according to a first pulse duration parameter;
    based on the erase indicator, determining a second pulse duration parameter;
    and
    performing the second erase operation according to the second pulse duration parameter.

4. The method of claim 1, comprising:
    performing the first erase operation according to a set of erase control parameters associated with the memory block;
    based on the erase indicator, updating the set of erase control parameters to produce an updated set of erase control parameters; and
    performing the second erase operation according to the updated set of erase control parameters.

5. The method of claim 1, comprising:
    updating a condition parameter associated with the memory block based on the number of pulses applied to the block;
    determining an error threshold based on the condition parameter; and terminating an erase procedure based on the error threshold.

6. The method of claim 1, comprising:
updating a condition parameter associated with the memory block based on the set of erase parameters applied to the block;
determining an error threshold based on the condition parameter; and
terminating an erase procedure based on the error threshold.

7. The method of claim 1, comprising:
storing information defining the position of bits that were improperly erased; and
decoding the bits using the position information to reduce the probability of decoding failure.

8. A controller for managing information in a set of flash memory cells included in a memory block, the controller having stored thereon instructions that when executed cause the controller to:
perform a first erase operation, the operation including applying a first number of erase pulses to the memory block;
calculate an erase indicator based on counting flash memory cells storing data;
based on the erase indicator, determine a second number of erase pulses; and
perform a second erase operation including the second number of erase pulses.

9. The controller of claim 8, wherein the instructions when executed further cause the controller to:
perform the first erase operation according to a first erase voltage level;
based on the erase indicator, determine a second erase voltage level; and
perform the second erase operation according to the second erase voltage level.

10. The controller of claim 8, wherein the instructions when executed further cause the controller to:
perform the first erase operation according to a first pulse duration parameter;
based on the erase indicator, determine a second pulse duration parameter; and
perform the second erase operation according to the second pulse duration parameter.

11. The controller of claim 8, wherein the instructions when executed further cause the controller to:
perform the first erase operation according to a set of erase control parameters associated with the memory block;
based on the erase indicator, update the set of erase control parameters to produce an updated set of erase control parameters; and
perform the second erase operation according to the updated set of erase control parameters.

12. The controller of claim 8, wherein the instructions when executed further cause the controller to:
update a condition parameter associated with the memory block based on the number of pulses applied to the block;
determine an error threshold based on the condition parameter; and
terminate an erase procedure based on the error threshold.

13. The controller of claim 8, wherein the instructions when executed further cause the controller to:
update a condition parameter associated with the memory block based on the set of erase parameters applied to the block;
determine an error threshold based on the condition parameter; and
terminate an erase procedure based on the error threshold.

14. The controller of claim 8, wherein the instructions when executed further cause the controller to:
store information defining the position of bits that were improperly erased; and
decode the bits using the position information to reduce the probability of decoding failure.

15. A system comprising:
a memory unit comprising a plurality of memory blocks, wherein each memory block comprises a set of memory cells; and
a controller to manage information in each set of memory cells, whereing the controller is to:
perform a first erase operation, the operation including applying a first number of erase pulses to the memory block;
calculate an erase indicator based on counting memory cells storing data;
based on the erase indicator, determine a second number of erase pulses; and
perform a second erase operation including the second number of erase pulses.

16. The system of claim 15, wherein the controller is to:
perform the first erase operation according to a first erase voltage level;
based on the erase indicator, determine a second erase voltage level; and
perform the second erase operation according to the second erase voltage level.

17. The system of claim 15, wherein the controller is to:
perform the first erase operation according to a first pulse duration parameter;
based on the erase indicator, determine a second pulse duration parameter; and
perform the second erase operation according to the second pulse duration parameter.

18. The system of claim 15, wherein the controller is to:
perform the first erase operation according to a set of erase control parameters associated with the memory block;
based on the erase indicator, update the set of erase control parameters to produce an updated set of erase control parameters; and
perform the second erase operation according to the updated set of erase control parameters.

19. The system of claim 15, wherein the controller is to:
update a condition parameter associated with the memory block based on the number of pulses applied to the block;
determine an error threshold based on the condition parameter; and
terminate an erase procedure based on the error threshold.

20. The system of claim 15, wherein the memory unit is a flash memory unit comprising flash memory cells.

* * * * *